United States Patent [19]

Watanabe et al.

[11] Patent Number: 5,072,263

[45] Date of Patent: Dec. 10, 1991

[54] THIN FILM EL DEVICE WITH PROTECTIVE FILM

[75] Inventors: Takehito Watanabe; Satoshi Tanda; Takashi Nire, all of Kanagawa, Japan

[73] Assignee: Kabushiki Kaisha Komatsu Seisakusho, Tokyo, Japan

[21] Appl. No.: 700,947

[22] Filed: May 14, 1991

Related U.S. Application Data

[63] Continuation of Ser. No. 587,502, Sep. 24, 1990, abandoned, which is a continuation of Ser. No. 360,930, filed as PCT/JP87/00691, Sep. 18, 1987, abandoned.

[30] Foreign Application Priority Data

Sep. 19, 1986 [JP] Japan ............................... 61-221450
Oct. 13, 1986 [JP] Japan ............................... 61-242831

[51] Int. Cl.[5] ............................................ H01L 33/00

[52] U.S. Cl. ....................................... 357/17; 357/54; 357/72; 357/52; 357/71

[58] Field of Search ............... 357/17, 52, 52 C, 52 T, 357/52 R, 54, 71, 72

[56] References Cited

U.S. PATENT DOCUMENTS

| | | | |
|---|---|---|---|
| 4,613,546 | 9/1986 | Kuwata et al. | 357/54 X |
| 4,714,951 | 12/1987 | Bavorant et al. | 357/54 X |
| 4,891,684 | 1/1990 | Nishioka et al. | 357/54 X |

FOREIGN PATENT DOCUMENTS

| | | | |
|---|---|---|---|
| 55-52253 | 4/1980 | Japan | 357/52 C |
| 55-124182 | 9/1980 | Japan . | |
| 59-110122 | 6/1984 | Japan | 357/52 C |
| 1128567 | 5/1989 | Japan | 357/52 C |

OTHER PUBLICATIONS

Halstead, "Corrosion Protection by Aluminum Anodization," *IBM Technical Disclosure Bulletin*, vol. 20, No. 10, Mar. 1978, pp. 3849–3850.

*Primary Examiner*—William Mintel
*Attorney, Agent, or Firm*—Armstrong, Nikaido, Marmelstein, Kubovcik & Murray

[57] ABSTRACT

A thin-film EL device of which the surface is coated with a protective film of a two-layer structure consisting of an insulating film (10) and a metallic film (20) in order to obtain good air-tightness and high reliability. The insulating film (10) consists of any one of a silicon oxide film, a silicon nitride film, an aluminum oxide film or a tantalum oxide film, and the metallic film consists of a thin film of either aluminum or tantalum.

6 Claims, 6 Drawing Sheets

THIN FILM EL DEVICE WITH PROTECTIVE FILM

This application is a continuation of application Ser. No. 587,502, filed Sept. 24, 1990, which is a continuation of application Ser. No. 360,930, filed as PCT/JP87/00691, Sep. 18, 1987, both now abandoned.

TECHNICAL FIELD OF THE INVENTION

The present invention relates to a thin-film EL device and, more particularly, to a thin film EL device having a double dielectric structure and the sealing structure thereof.

BACKGROUND ART OF THE INVENTION

A thin film type EL device (hereinunder referred to as "thin-film EL device") using a thin-film fluorescent layer has attracted attentions in place of a dispersion EL device using a powder of a zinc sulfide (ZnS) fluorescent material, because the former can provide a high luminance while the latter cannot provide a sufficient luminance so that the development thereof as a light source of illumination has been inevitably abandoned.

The thin-film EL device has a light emission layer composed of a transparent thin film and scarcely scatters the light entering from the outside and the light emitted in the interior of the light emission layer which would otherwise produce halation or blurring. Since the thin-film EL device produces a clear image having a high contrast, it has attracted attentions as a display for mounting on vehicles, for terminal devices and the like, and as a device for illumination.

For example, the fundamental structure of a thin-film EL device which uses manganese (Mn) as the luminescence center in ZnS is a double dielectric structure in which on a light-transmitting substrate 1, a light-transmitting electrode 2 consisting of a tin oxide ($SnO_2$) layer or the like, a first dielectric layer 3, a light emission layer 4 consisting of a crystalline thin film having ZnS as a host material and Mn as the luminescence center impurity, namely, a ZnS:Mn thin film, a second dielectric layer 5, and a back electrode 6 consisting of an aluminum (Al) layer or the like are laminated in series in that order, as shown in FIG. 1.

The equivalent circuit of the thin-film EL device can be represented as three capacitors consisting of the first dielectric layer 3, the light emission layer 4 and the second dielectric layer 5 which are connected to each other in series, as shown in FIG. 2.

The process of the light emission of the thin-film EL device is as follows.

When a voltage is applied between the light-transmitting electrode and the back electrode, the electric field induced in the light emission layer attracts the electrons which have been trapped in the order of the interface and accelerates the electrons so as to provide a sufficient energy. These electrons collide with the orbital electrons of Mn which is the luminescence center and excite them. When the thus-excited luminescence center returns to the ground state, light is emitted.

In order to increase the voltage applied to the light emission layer in such a thin-film EL device, it is considered to be good that the relative dielectric constants $\epsilon_1$ and $\epsilon_2$ of the first and second dielectric layers are sufficiently larger than the relative dielectric constant $\epsilon_3$ of the light emission layer ($\epsilon_l < \epsilon_{r1}, \epsilon_{r2}$). That is, since the electric capacitances of the first and second dielectric layers thereby become sufficiently larger than that $C_l$ of the light emission layer ($C_l < C_{r1}, C_{r2}$), almost all the voltage applied from the outside to the device is applied only to the light emission layer.

For the above-described reason, for the dielectric layers on both sides of the light emission layer, a material having a high dielectric constant, in other words having a relative dielectric constant $\epsilon$ of about 20 to 100 is used. In addition, in order to prevent a current from flowing on the thin-film EL device, a material having a resistivity as high as about $10^{13}$ to $10^{14}$ Ωcm is used.

However, the voltage-luminance characteristic curve of the thin-film EL device having such a structure is such as the curve b shown in FIG. 12, and unless the driving voltage is comparatively high, the desired luminance is not obtained.

The sealing structure of a conventional thin-film EL device is composed of a protective glass 8 which is pasted to the substrate 1 by an epoxy adhesive 7, and a silicon oil 9 which is charged into the space formed between the protective glass 8 and the surface of the thin-film EL device, as shown in FIG. 1.

A thin-film EL device having such a sealing structure, however has a poor air-tightness which sometimes allows water to mix with the oil. The water often breaks the thin-film EL device, which is a cause of lowering the reliability.

SUMMARY OF THE INVENTION

The present invention has been achieved in view of the above-described problems in the prior art and it is an object of the present invention to provide a thin-film EL device having a good air-tightness and high reliability.

It is another object of the present invention to provide a thin-film EL device which is capable of providing a sufficient luminance even under a low driving voltage.

In order to achieve at least one of the objects, in a first aspect of the present invention, there is provided a thin-film EL device characterized in that the surface of a thin-film EL device is covered with a protective film having a two-layer structure consisting of an insulating film and a metal film.

In order to achieve at least one of the objects, in a second aspect of the present invention, there is provided a thin-film EL device having a double dielectric structure in which on a substrate, a light-transmitting electrode, a first dielectric layer, a light emission layer, a second dielectric layer and a back electrode are laminated in series in that order, characterized in that a thin film having a low electric resistance is inserted both between the first dielectric layer and the light emission layer and between the light emission layer and the second dielectric layer.

The above and other advantages, features and objects of the invention will be apparent to those who are skilled in the art from the following description of the preferred embodiments thereof, taken in conjunction with the accompanying drawings.

BEST MODE FOR CARRYING OUT THE INVENTION

Preferred embodiments of the present invention will be explained in detail hereinunder with reference to FIGS. 3 to 12.

Figure 3:
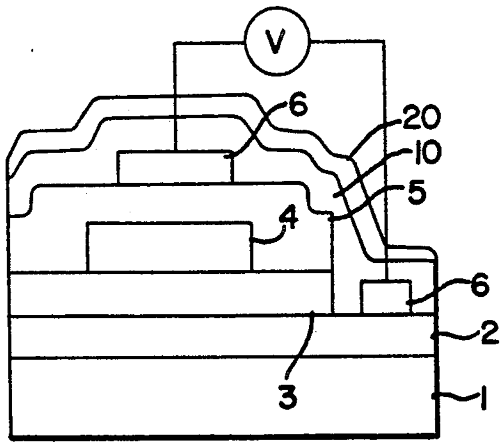
FIG. 3 is a schematic vertical sectional view of a first embodiment of a thin-film EL device according to the present invention.

FIG. 3 is a schematic vertical sectional view of a first embodiment of a thin-film EL device according to the present invention;

The thin-film EL device is characterized in that the surface thereof is covered with a protective film having a two-layer structure consisting of a silicon oxide film 10 and an aluminum film 20. Other portions are the same as in a conventional thin-film EL device. The same numerals are provided for the elements which are the same as those in the conventional thin-film EL device.

When manufacturing the thin-film EL device, after a thin-film EL device is produced by an ordinary thin-film technology, the silicon oxide film 10 is formed by CVD and subsequently the aluminum film 20 is formed in the same chamber by CVD using trimethyl aluminum.

In this way, since the protective film has a two-layer structure consisting of the silicon oxide film having a high electric insulation quality and the aluminum film which does not allow water permeation, the thin-film EL device has a very high sealing effect.

In addition, since all of these steps can be carried out in vacuum, water does not enter during the process and it is therefore possible to provide a thin-film EL device having a long life and high reliability.

Figure 4:
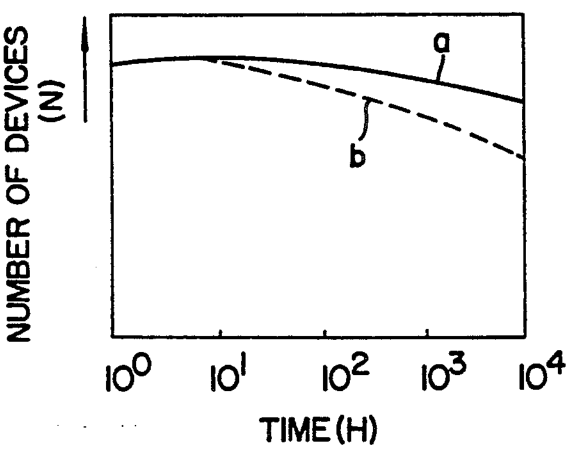
FIG. 4 is a graph showing the result of the life test of the first embodiment of the present invention as compared with that of a conventional thin-film EL device.

The result of the life test (at a temperature of 85° C. and a humidity of 80%) of the thin-film EL device having the thus-formed protective film, namely, the relationship between the lighting time H (abscissa) and the number N (ordinate) of the thin-film EL devices which are acting normally is shown by the curve a in FIG. 4.

It is assumed that the number of all devices is N.

Figure 1:
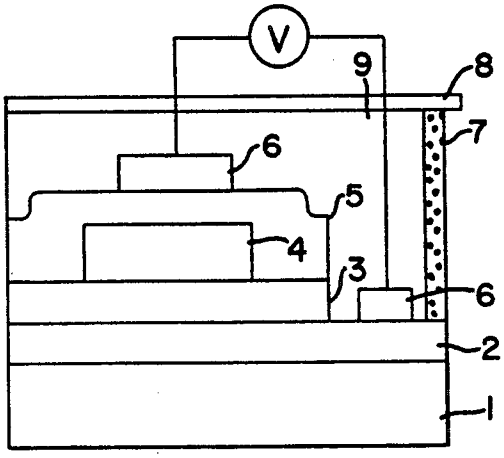
FIG. 1 PRIOR ART
FIG. 1 is a schematic vertical sectional view of a conventional thin-film EL device.
Figure 2:
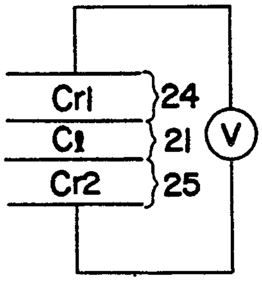
FIG. 2 PRIOR ART
FIG. 2 shows an equivalent circuit of a conventional thin-film EL device.

For comparison, the result of the same test applied to the conventional thin-film EL device shown in FIG. 1 is shown by the curve b in FIG. 4.

As is clear from comparison between the curves a and b, according to the thin-film EL device of the present invention, the life is greatly prolonged and the reliability is enhanced.

Although the silicon oxide film is used as an insulating film in this embodiment, a film may be appropriately selected from an organic film such as a polyimide film as well as an inorganic film such as a silicon nitride ($Si_3N_4$) film, aluminum oxide ($Al_2O_3$) film, tantalum oxide ($TaO_2$) film and a film having a two-layer structure of an oxide silicon film and a silicon nitride film.

The metal film is not restricted to an aluminum film and a metal film such as a tantalum film may also be used.

Figure 5:
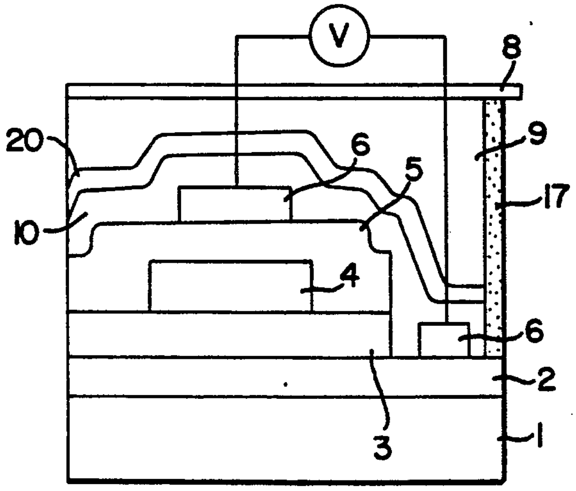
FIG. 5 is a schematic vertical sectional view of a second embodiment of a thin-film EL device according to the present invention.

It is also possible to seal the surface of the device with glass as in the prior art after it is covered with such a protective film, as shown in FIG. 5.

More specifically, after the surface of the device is covered with a protective film consisting of the silicon oxide film 10 and the aluminum film 20, a protective glass 8 is pasted to the substrate 1 by a fluorine plastic adhesive 17, and silicon oil is charged into the interior 9.

As the adhesive, a fluorine plastic adhesive is used in place of an epoxy resin adhesive which is conventionally used. This enhances the air-tightness so much as to allow almost no water permeation.

In this way, the double sealing further enhances the reliability.

Figure 6:
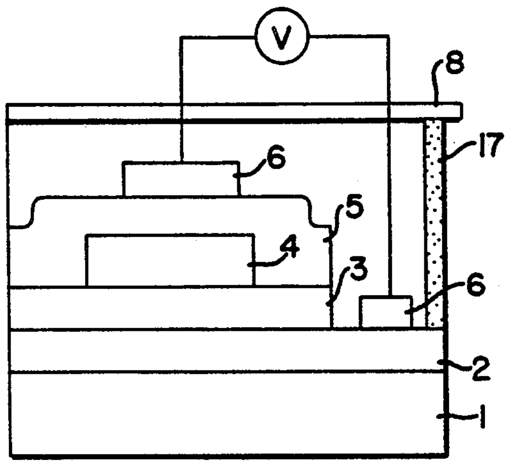
FIG. 6 is a schematic vertical sectional view of a third embodiment of a thin-film EL device according to the present invention.

Since the fluorine plastic adhesive provides a much higher air-tightness than the conventionally used epoxy resin adhesive, even a single sealing structure without the protective film in which the protective glass 8 is secured to the substrate 1 by the fluorine plastic adhesive 17, as shown in FIG. 6, displays a sufficient effect.

Figure 7:
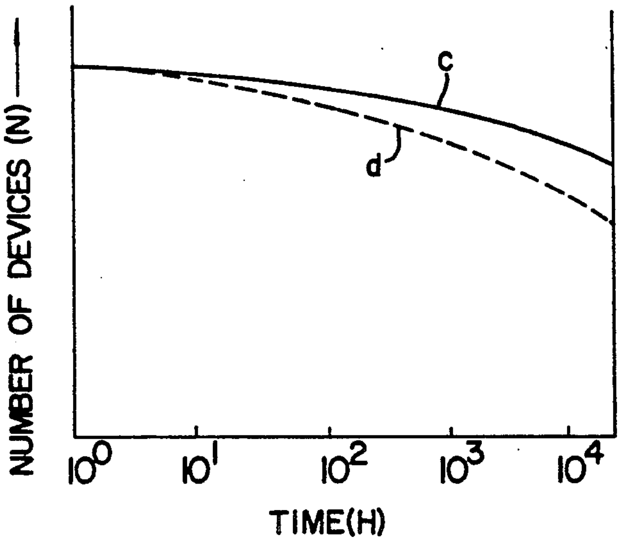
FIG. 7 is a graph showing the result of the life test of thin-film EL devices having different sealing adhesives.

FIG. 7 shows the results of the life test of thin-film EL devices having a single sealing structure in which different adhesives are used. The curve c shows the case in which a fluorine plastic adhesive is used and the curve d the case in which a conventionally used epoxy resin adhesive is used. The testing conditions were that the temperature was 80° C. and the humidity was 85%.

From FIG. 7, it is clear that use of a fluorine plastic resin prolongs the life.

The sealing plate may be composed of a protective film of a thermoplastic resin such as acryl and plastic which is light and has good processability in place of a glass.

Figure 8:
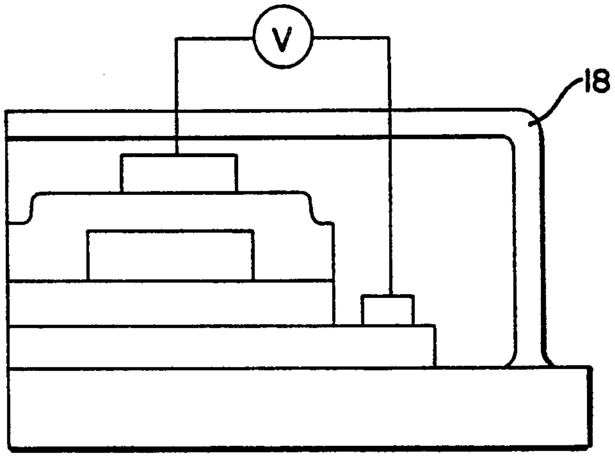
FIG. 8 is a schematic vertical sectional view of a fourth embodiment of a thin-film EL device according to the present invention.

Since a thermoplastic resin 18 allows heat bonding directly to the glass substrate 1 of the thin-film EL device, as shown in FIG. 8, it dispenses with an adhesive, so that it is possible to prevent water from permeating the adhesive.

Figure 9A:
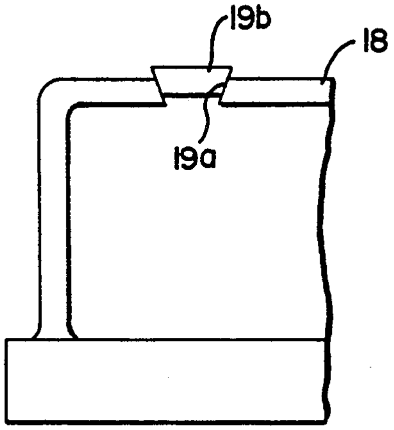
FIGS. 9A and 9B show the oil inlet of the fourth embodiment shown in FIG. 8.
Figure 9B:
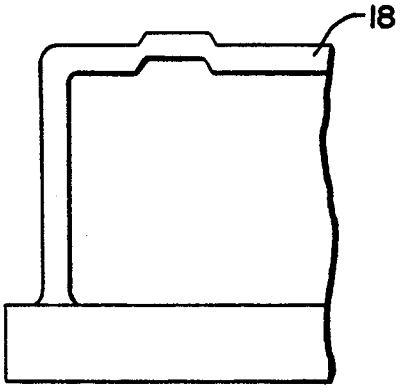

When an oil such as silicon oil is charged, for example, an oil inlet 19*a* is formed on the sealing plate consisting of an acrylic resin 18, as shown in FIG. 9A, and after the oil is charged, the oil inlet 19*a* is heated while being plugged with an inlet sealing pin 19*b*, whereby the oil inlet 19*a* and the inlet sealing pin 19*b* are welded together, as shown in FIG. 9B, and sealing is facilitated.

Figure 10:
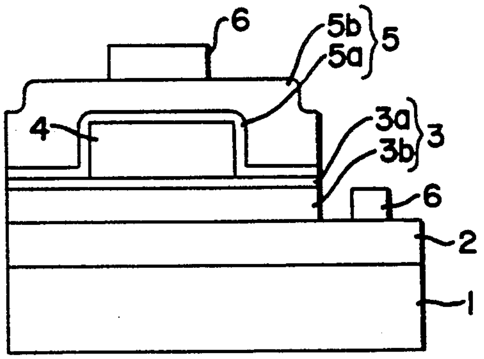
FIG. 10 is a schematic vertical sectional view of a fifth embodiment of a thin-film EL device according to the present invention.

In order to obtain a sufficient luminance even under a low driving voltage, the present invention provides a thin-film EL device shown in FIG. 10 as a fifth embodiment.

The thin-film EL device is characterized in that it has a double dielectric structure in which each of the first dielectric layer 3 and the second dielectric layer 5 of tantalum oxide (TaOx) on both sides of the light emission layer 4 has a two-layer structure. The double structures of the first and second dielectric layers 3 and 5 are respectively composed of first and second inner layers 3*a* and 5*a* which have a resistivity gradually and continuously increasing from $10^8$ to $10^{12}$ Ωcm and first and second outer layers 3*b* and 5*b* which have as high a resistivity as $10^{14}$ Ωcm.

The other structure is the same as that of an ordinary thin-film EL device, which has a double dielectric structure in which on a light-transmitting substrate 1, the light-transmitting electrode 2 consisting of a tin oxide ($SnO_2$) layer, the first dielectric layer 3, the light emission layer 4 consisting of a crystalline thin film having ZnS as a host material and Mn as the luminescence center impurity, namely, a ZnS:Mn thin film, the second dielectric layer 5, and the back electrode 6 consisting of an aluminum layer are laminated in series in that order.

A method of manufacturing the thin-film EL device will now be explained.

Figure 11A:
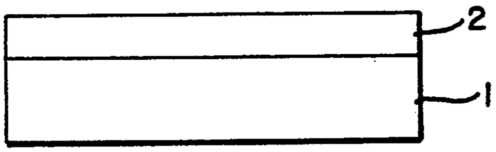
FIGS. 11A to 11D shows the manufacturing steps for the fifth embodiment of the present invention.

The light-transmitting electrode 2 consisting of an $SnO_2$ layer is first formed on the light-transmitting glass substrate 1 by sputtering, as shown in FIG. 11A.

Figure 11B:
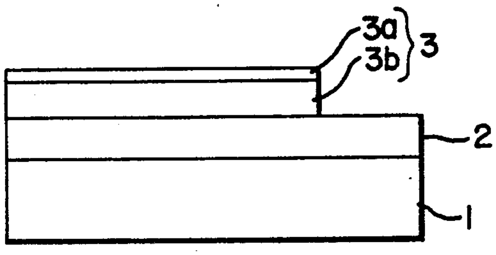

The first dielectric layer 3 consisting of the first outer layer 3*b* and the first inner layer 3*a* is next formed by sputtering while using tantalum oxide as the target, as shown in FIG. 11B. When the first outer layer 3*b* is formed, the partial pressure of oxygen is raised in the initial stage and gradually lowered. Finally, by lowering the pressure of oxygen, the first inner layer 3*a* having a low resistance is formed.

Figure 11C:
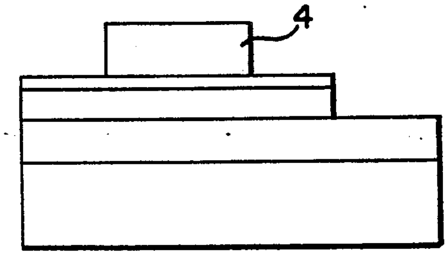

The light emission layer 4 consisting of the ZnS:Mn columnar polycrystals is then formed by deposition, as shown in FIG. 11C. In order to obtain the ZnS:Mn columnar polycrystals having a good crystallinity, Zn, S and Mn are charged into different crucibles. The vapor pressure of the vacuum container is set at about $10^{-5}$ Torr, and the temperature of the glass substrate 1 is set in an appropriate temperature range of 100° to 300° C. while the temperatures of the respective crucibles are controlled separately from each other.

Figure 11D:
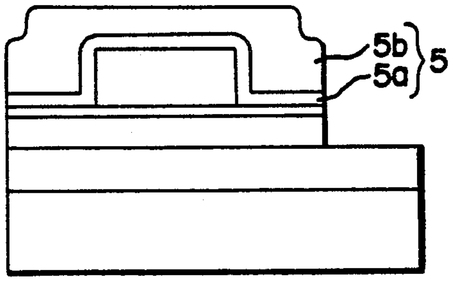

The second dielectric layer 5 consisting of the second inner layer 5*a* and the second outer layer 5*b* is next formed by sputtering while using tantalum oxide as the target, as shown in FIG. 11D. Conversely to the formation of the first dielectric layer 3, the partial pressure of oxygen is lowered so as to form the second inner layer 5*a* and, while the partial pressure is gradually raised, the second outer layer 5*b* having a gradually increasing resistance is formed.

Finally, an aluminum thin film is formed by vacuum deposition and patterned by photolitho-etching so as to form the back electrode 6, thereby completing the thin-film EL device shown in FIG. 10.

Figure 12:
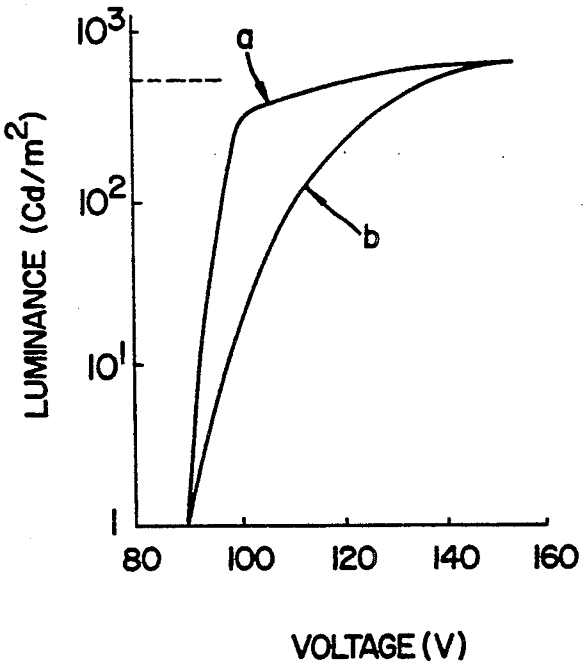
FIG. 12 is a graph showing the luminance-voltage characteristic of the fifth embodiment of the present invention as compared with that of a conventional thin-film EL device.

The luminance-voltage characteristic of the thus-produced thin-film EL device is represented by the curve a in FIG. 12. The curve b represents the luminance-voltage characteristic of a conventional thin-film EL device having a double dielectric structure for comparison. As is clear from comparison between the curves a and b, the luminance of the thin film of the present invention under a voltage at the beginning of lighting is the same as that of the conventional one, but the rise of the curve of the thin-film EL device of the present invention is steep.

Therefore, according to the thin-film EL device of the present invention, the driving voltage required for producing, for example, a luminance of 500 cd/m$^2$ is as low as about 120 V, while the conventional one is required to have about 150 V.

In addition, no particular additional step is necessary for the manufacture of the thin-film EL device of the present invention except for the control of the partial pressure of oxygen.

As a result of measuring the luminance-voltage characteristic while changing the resistivity of the first and second inner layers 3*a* and 5*a*, it was found that since no effect was manifested when the resistivity was less than $10^8$ Ωcm, the resistivity should be set in the range of $10^8$ to $10^{12}$ Ωcm.

Although the layers in contact with the light emission layer have a low resistance which is gradually increased in proportion to the distance from the light emission layer in the fifth embodiment, the outer layers may be a high-resistance layer having a predetermined resistance.

Furthermore, although tantalum oxide is used for the thin film having a low resistance in the fifth embodiment, it goes without saying that the material is not restricted to tantalum oxide and other materials are usable.

We claim:

1. A thin-film EL device having a double dielectric structure comprising a light-transmitting substrate, a light-transmitting electrode formed on said substrate, a first dielectric layer formed on said electrode, a single electroluminescent layer as a light emission layer formed on said first dielectric layer, a second dielectric layer formed on said light emission layer, an electrode for applying a voltage to said light emission layer formed on said second dielectric layer, and a protective film having a two-layer structure for electric insulation and low water permeability composed of an insulating film and a metal film formed over surfaces of said thin-film EL device.

2. A thin-film EL device according to claim 1, wherein said insulating film is one selected from the group consisting of a silicon oxide film, silicon nitride film, aluminum oxide film and tantalum oxide film.

3. A thin-film EL device according to claim 1, wherein said metal film is one selected from the group consisting of an aluminum film and a tantalum film.

4. A thin-film EL device having a double dielectric structure comprising a light-transmitting substrate, a light-transmitting electrode formed on said substrate, a first dielectric layer formed on said electrode, a single electroluminescent layer as a light emission layer formed on said first dielectric layer, a second dielectric layer formed on said light emission layer, an electrode for applying a voltage to said light emission layer formed on said second dielectric layer, and a film having an electric resistance inserted both between said first dielectric layer and said light emission layer and between said light emission layer and said second dielectric layer.

5. A thin-film EL device according to claim 4, wherein each of said first and second dielectric layers is composed of a tantalum oxide (TaOx) layer and said film having resistance is composed of a tantalum oxide (TaOx) layer in which content of oxygen is lower than that of said tantalum oxide layer for said first and second dielectric layers.

6. A thin-film EL device according to either of claims 4 and 5, wherein said resistivity is not less than $10^8$ Ωcm.

* * * * *